(12) United States Patent
Prall et al.

(10) Patent No.: US 6,229,148 B1
(45) Date of Patent: *May 8, 2001

(54) ION IMPLANTATION WITH PROGRAMMABLE ENERGY, ANGLE, AND BEAM CURRENT

(75) Inventors: Kirk Prall; Alan R. Reinberg, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 27 days.

(21) Appl. No.: 08/909,345

(22) Filed: Aug. 11, 1997

(51) Int. Cl.[7] .................. H01J 37/317; H01J 37/702
(52) U.S. Cl. ............................ 250/492.21; 250/442.11
(58) Field of Search ....................... 250/492.21, 442.11

(56) References Cited

U.S. PATENT DOCUMENTS

| | | | |
|---|---|---|---|
| 3,697,827 | 10/1972 | Simon | 317/235 |
| 3,778,626 | * 12/1973 | Robertson | 250/492.21 |
| 3,897,274 | 7/1975 | Stehlin et al. | 148/1.5 |
| 4,258,077 | * 3/1981 | Mori et al. | 250/492.21 |
| 4,410,801 | * 10/1983 | Sakurai et al. | 250/492.21 |
| 4,745,287 | * 5/1988 | Turner | 250/492.21 |
| 5,091,655 | 2/1992 | Dykstra et al. | 250/492.2 |
| 5,126,575 | 6/1992 | White | 250/492.3 |
| 5,136,171 | 8/1992 | Leung et al. | 250/492.2 |
| 5,155,369 | 10/1992 | Current | 250/492.2 |
| 5,160,846 | 11/1992 | Ray | 250/492.2 |
| 5,177,366 | 1/1993 | King et al. | 250/492.2 |
| 5,373,164 | 12/1994 | Benveniste | 250/492.21 |
| 5,389,793 | 2/1995 | Aitken et al. | 250/492.21 |
| 5,432,352 | 7/1995 | vanBavel | 250/492.21 |
| 5,510,648 | 4/1996 | Davies et al. | 257/657 |
| 5,641,969 | * 6/1997 | Cooke et al. | 250/442.11 |
| 5,648,277 | 7/1997 | Zhang et al. | 437/21 |
| 6,005,253 | * 12/1999 | Kong | 250/492.21 |

OTHER PUBLICATIONS

Ryssel, H., et al., *Ion Implantation*, John Wiley & Sons Pub., 138–9, 148–9,158–9, (1986).
Wolf, S., "Ion Implantation for VLSI,"*Silicon Processing for the VLSI Era, vol. 1*, Lattice Press, Sunset Beach CA, 309, (1986).

* cited by examiner

*Primary Examiner*—Jack Berman
(74) *Attorney, Agent, or Firm*—Schwegman, Lundberg, Woessner & Kluth, P.A.

(57) ABSTRACT

A method and apparatus for performing multiple implantations in a semiconductor wafer is used to set variable implantation waveforms. An implanter is used, which allows for setting of variable waveforms, corresponding to energy, beam current, and angle, used for implantation. At least one of a ramping voltage, a ramping beam current source, and a programmable motor mechanically connected to a wafer table is used to obtain the variable waveforms. Using the implanter and method of the invention, detailed doping profiles are created using only a single implant. Such detailed doping profiles are used to create high gradient retrograde wells, and transistors with punch-through suppression implants and channel implants with controlled dopant gradients.

18 Claims, 5 Drawing Sheets

ION IMPLANTATION WITH PROGRAMMABLE ENERGY, ANGLE, AND BEAM CURRENT

FIELD OF THE INVENTION

The present invention relates to methods and apparatus for implanting ions during semiconductor manufacturing by using programmable waveforms.

BACKGROUND OF THE INVENTION

Semiconductor integrated circuits (ICs) are typically manufactured using a series of deposition, implantation, and annealing steps to form desired regions and junctions within a semiconductor wafer. Implantation is premised on the theory of implanting different elements in a wafer using different energy levels, doses, and angles to achieve the optimum dopant concentration and junction depth in a wafer. An implant dose is determined by the beam current applied to ionize the elements to be implanted, implant time, and beam diameter. A higher beam current ionizes more particles, resulting in a higher implant dose concentration. Implant depth is controlled by varying the implant energy and/or angle. To achieve deeper junctions, higher energy levels and/or angles that allow channeling are used. Channeling is the phenomenon whereby implanted ions travel easily through specific crystallographic orientations.

As IC technology advances, multiple ion implants are becoming more prevalant to allow detailed engineering of doping profiles, which optimizes transistor and other IC device performance. Currently, to perform such multiple implants, implantation equipment stops the implantation beam current after each particular energy and dose. This is done either with or without removing the wafers from the chamber. The implant dose, energy, and/or angle are then changed prior to restarting the next implantation. This unduly burdens the manufacturing process due to the added overhead and cost associated with such downtime.

As a result of such high costs associated with changing implant dose, energy, and/or angles, device designers are forced to use fewer implants. Instead, they must use more DT (i.e., a combination of time spent in a furnace and the temperature at which the furnace is set). DT is needed to merge implants together by diffusing implanted ions through the wafer, a process which ideally is performed by using multiple implants to create such profiles.

It is undesirable to rely so heavily on DT to obtain desired impurity profiles. DT degrades steep implant profiles that are often crucial in ICs. A conventional doping profile is shown in FIG. 1A, resulting from three separate implants. The number of dopants, N, is plotted versus the depth, X, in a wafer. FIG. 1B, shows the effects of a 1,050 to 1,150 degrees Celsius DT for two hours used to obtain a final doping profile. As ICs are scaled down, steep implant profiles are even more critical to optimized device performance because there is less area within which to obtain desired dopant density variations necessary for proper device performance. As can be seen from FIG. 1B, previous techniques of forming doping profiles do not result in steep, sharply defined profiles. Furthermore, DT often results in significant lateral spread of the implanted dopants, undesirably decreasing achievable integrated circuit (IC) density.

Another problem with relying so heavily on DT is that it reduces valuable thermal budget required for many process steps needed for forming ICs. The thermal budget for a particular device is the amount of time and temperature that the device can withstand before device performance is degraded. Many process steps reduce the remaining thermal budget. It is thus critical to conserve thermal budget when possible.

There is a need for a technique for implanting semiconductor wafers which allows for efficient multiple implants. There is a need to decrease the amount of overhead and cost associated with changing implantation energy, dose, and/or angle between such implants. It is further desirable to decrease the amount of DT, which is currently used and needed, for forming doping profiles in semiconductor wafers. A technique for forming steeper, sharply defined doping profiles is needed in order to keep pace with performance standards required of ever shrinking device geometries in today's ICs.

SUMMARY OF THE INVENTION

The present invention teaches a method and apparatus for performing multiple implantations in a semiconductor wafer. An implanter is used, which allows for setting of variable waveforms, corresponding to energy, beam current, and angle, used for implantation. A ramping voltage is used to vary the energy level of the ions during a single implant step. A ramping beam current source provides a variable density of ions. Furthermore, a programmable motor is mechanically connected to a wafer table, which allows for automatic programmed tilting of a substrate being implanted on the wafer table.

An implanter with the capability of using variable waveforms for the energy, beam current, and angle gives device designers a big advantage. Using the implanter and method of the invention, detailed or well defined doping profiles are created using only a single implant, which previously required multiple implants to create. Such detail includes the ability to provide sharp transitions in doping density. By creating the doping profile using a single implant, the amount of DT (i.e., a combination of time spent in a furnace and the temperature at which the furnace is set) needed to produce the optimum profile is minimized and, in some cases, eliminated. The amount of overhead and cost associated with producing optimum doping profiles is also minimized using the invention due to the ability to create the optimum doping profiles in a single implant.

In one embodiment, during an implant, the energy levels of the ions are ramped at least twice to form detailed doping profiles. During such implant, the energy levels are ramped by applying a voltage to the acceleration tube and ramping it at approximately 75 to 160 keV/s, decreasing the ramp rate for a time, and then ramping it again at between approximately 300 to 2,500 keV/s to obtain an ending voltage of approximate 200 keV to 1 MeV prior to turning off the voltage.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. For example, the terms wafer and substrate used in the following description include any semiconductor-based structure. Wafer and substrate are used interchangeably to refer to semiconductor structures during processing. Both are to be understood as including silicon-on-insulator (SOI) technology, silicon-on-sapphire (SOS) technology, doped and undoped semiconductors, epitaxial layers of a semiconductor supported by a base semiconductor, as well as gallium arsenide, indium phosphide, and other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims.

Figure 2:
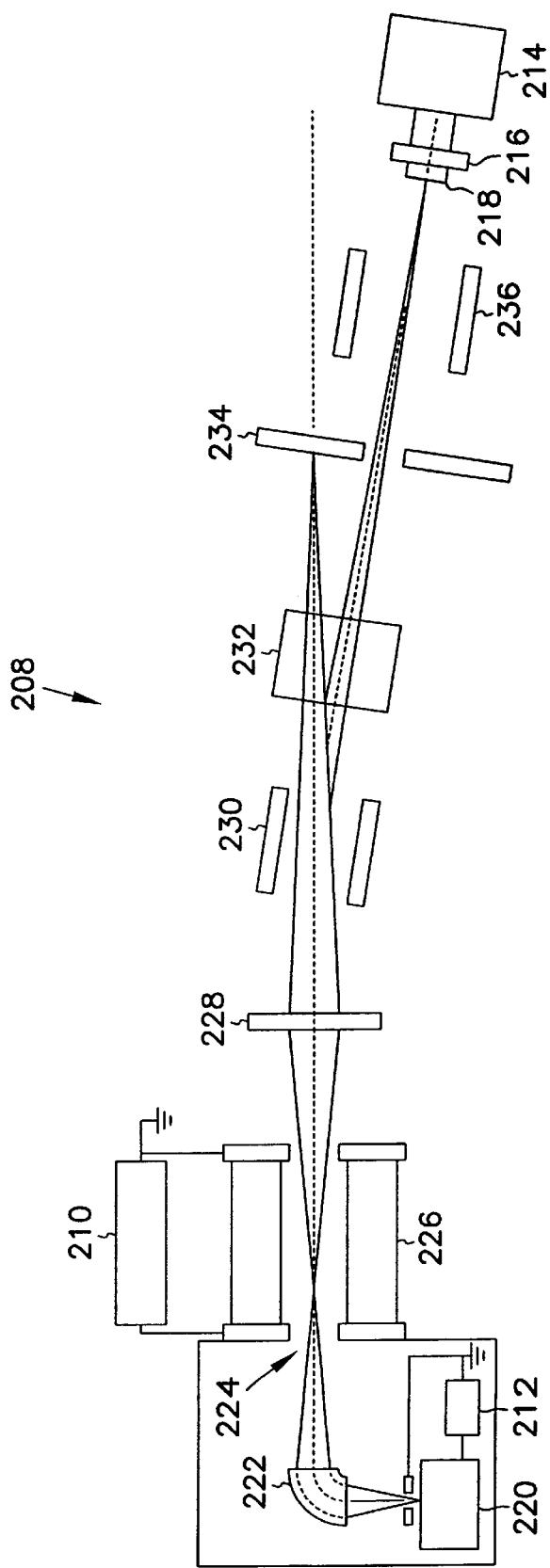
FIG. 2 is a schematic block diagram of an implanter utilized in one embodiment of the invention.

Implantation is performed according to the invention using an implanter, as shown generally at 208 in FIG. 2, having at least one of the following: a ramping voltage supply Vs, a ramping beam current supply 212, a ramping acceleration tube voltage controller 210, and a programmable motor 214 mechanically connected to a wafer table 216 for tilting a wafer 218 being implanted. The various components of the implanter 208 are supported and properly positioned in an implanter case in a known manner. To implant elements into the wafer 218, elemental ions are created by applying a beam current to an ion source 220. Ionized particles then travel through an analyzing magnet 222, where they are separated into beams corresponding to their ionic mass. Selected beams then travel in a vacuum system through a resolving aperture 224 and an acceleration tube 226 prior to being received by a focusing lens 228. From the focusing lens 228, the ionic beams travel through a neutral beam trap and beam gate 230. Then the ionic beams are directed through a y-axis scanner 232, beam trap and gate plate 234, and x-axis scanner 236, prior to contacting the wafer 218.

According to one aspect of the invention, the ramping voltage supply Vs provides a ramped voltage across the acceleration tube 226. A ramping voltage supply Vs, as well known to one skilled in the art, is substituted for a constant voltage supply in current implanters. Such a ramped voltage supply is useful in many applications, particularly for forming implanted regions and junctions at varying depths in a wafer 218, without the need for performing multiple implants and diff-using them together using DT (i.e., a combination of time spent in a furnace and the temperature at which the furnace is set). In the alternative, the ramping voltage controller 210 provides a variable voltage across the acceleration tube to impart selected energies to the ionized particles. It should be noted that the energies imparted to the particles are a function of the total energy prior to entering the acceleration tube 226 plus the energy imparted to the particles as they travel through the acceleration tube 226 both of which energies may be ramped.

The implanter 208 just described is ideal for use in forming three dimensional structures such optimized retrograde wells, having sharp implant doping profiles, such as those desired in buried p-channel devices. For optimization of the doping profiles of such wells, a minimum amount of DT is desired, so as not to degrade the sharp implant profile. Many semiconductor devices require initial formation of a well in the substrate to form a device operable by a desired corresponding charge carrier. For example, complementary metal-oxide-semiconductor (CMOS) technology uses one p-channel device and one n-channel device for each CMOS combination.

Retrograde wells are characterized by an increasing dopant concentration extending from a wafer's surface to the well/substrate junction. Most dopants are concentrated around the junction due to the high implant energy used. Such wells are preferred over conventional wells, which have a decreasing dopant concentration from a wafer's surface to the well/substrate junction. Devices formed in retrograde wells are less susceptible (than those formed in conventional wells) to vertical punch-through and latchup. Punch-through and latchup are particularly undesirable in ICs due to their power dissipation tendencies.

Their immunity to punch-through is one reason that retrograde wells are desired for use with buried channel transistors. Buried channel transistors are commonly found in p-channel devices. Such transistors are fabricated in an attempt to adjust (usually decrease) the threshold voltage of the transistor, to obtain maximum current driving capabilities.

Figure 1A:
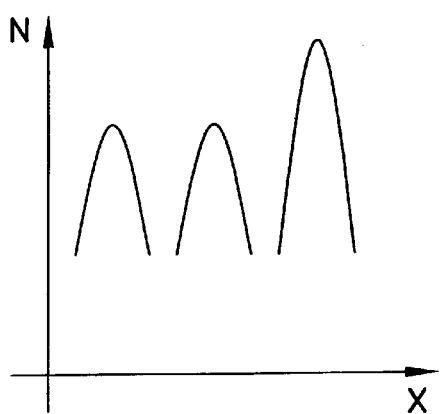
FIG. 1A is a graphical representation of a convention prior art doping profile of three separate implants.
Figure 1B:
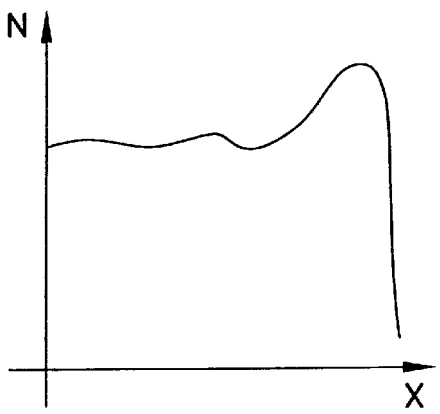
FIG. 1B is a graphical representation of the effects of DT on such prior art implants.
Figure 3A:
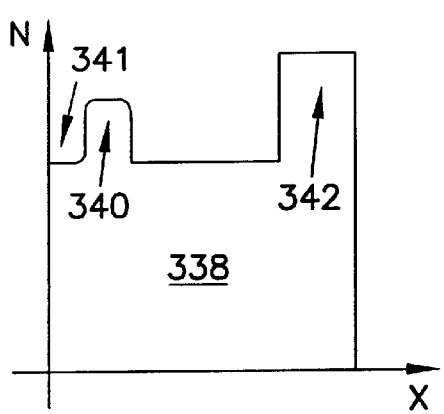
FIG. 3A is a doping profile for an optimized retrograde well produced using the method of the invention.
Figure 3B:
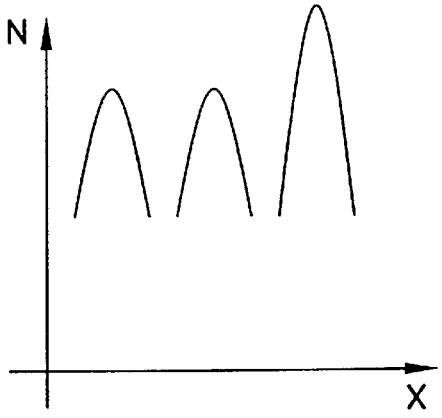
FIG. 3B is a doping profile for a conventional prior art retrograde well.

FIG. 3A shows a doping profile for an optimized retrograde well used for a buried p-channel device, formed in accordance with the invention. FIG. 3B shows a doping profile for a conventional retrograde well, formed using prior techniques and implanters. The log of the number of dopants, N, is plotted versus the implant depth, X, in a wafer. The number of dopants, N, corresponds to n-type dopants, such as arsenic and phosphorus, having a concentration of approximately $1 \times 10^{16}$ ions/cm$^3$ to $1 \times 10^{17}$ ions/cm$^3$ throughout the bulk of the doping profile. A retrograde well barrier 342 is concentrated at approximately $1\times10^{18}$ to $1\times10^{19}$ ions/cm$^3$ between approximately 1 and 5 microns below the surface of the wafer 218. A surface tailoring implant 340 is concentrated at approximately $1\times10^{17}$ to $1\times10^{18}$ ions/cm$^3$ between approximately 0.1 to 0.4 microns below the surface of the wafer 218. The surface tailoring implant 340 raises the dopant level to control the depth, X, of the subsequently formed buried channel. The buried channel is later formed in the region 341 between the surface of the wafer 218 and the surface tailoring implant 340. A cross-sectional representation of the retrograde well 338 formed according to the method of the invention is shown in FIG. 3C.

A retrograde well 338 is advantageously formed using the invention, as shown in FIG. 3A, having a dopant gradient exceeding N orders of magnitude per 0.1 micron depth change (where N=4, 5, 6, ... ), without the need to use DT to diffuse the conventionally implanted dopants, as shown in FIG. 3B. By using the implanter 208 of this invention, a very steep dopant gradient (i.e., one having a dopant gradient exceeding N orders of magnitude per 0.1 micron depth change; N=4, 5, 6, ...) can also be formed at the wafer 218 surface to limit the depth of the buried channel 340. This results in better short channel characteristics. This is a major advantage in p-channel transistors, which previously needed to be made with a longer channel and higher threshold voltage than that of n-channel transistors due to their higher susceptibility to leakage current. This invention also allows for a higher barrier height 342 at the bottom of the well due to the sharply-defined doping profile. A higher barrier height 342 minimizes susceptibility to punch-through, which has been a problem in the past for buried p-channel transistors.

Figure 4:
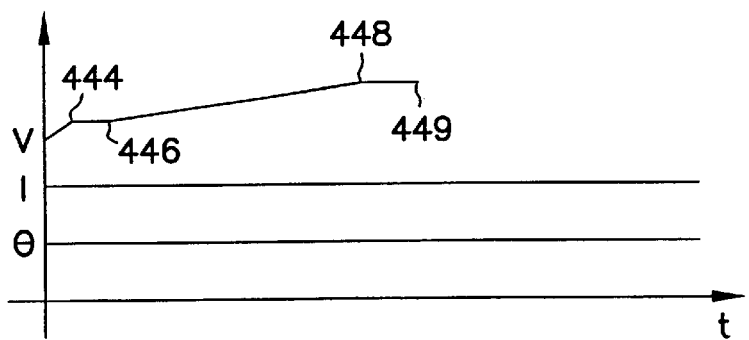
FIG. 4 is a graphical representation of implanter waveform versus time for forming an optimized retrograde well, as shown in FIGS. 3A and 3C.

FIG. 4 illustrates the programmable waveform used to form the optimized retrograde well of FIG. 3A, plotted versus implant time (t). In this example, the implant angle (θ) is held constant. This angle (θ) is typically zero degrees, measured perpendicular from the plane of the wafer 218. However, depending on one's desire, this angle (θ) can be adjusted accordingly to implant complex topographies or three dimensional structures with desired doping profiles. The beam current (I) is also held constant in this example, having a value of between approximately 0 to 20 mA, depending on the type of implanter used. For forming an optimized retrograde n-well 338 for a p-channel device, the doping profile of which is shown in FIG. 3A, the beam current, held at approximately 1 μA, results in an ion flux of phosphorus ions, a common dopant used to form an n-well. However, this process is also applicable to forming p-type retrograde wells and using other dopant types and concentrations, so the beam current is adjusted according to the type of device formed.

Figure 3C:
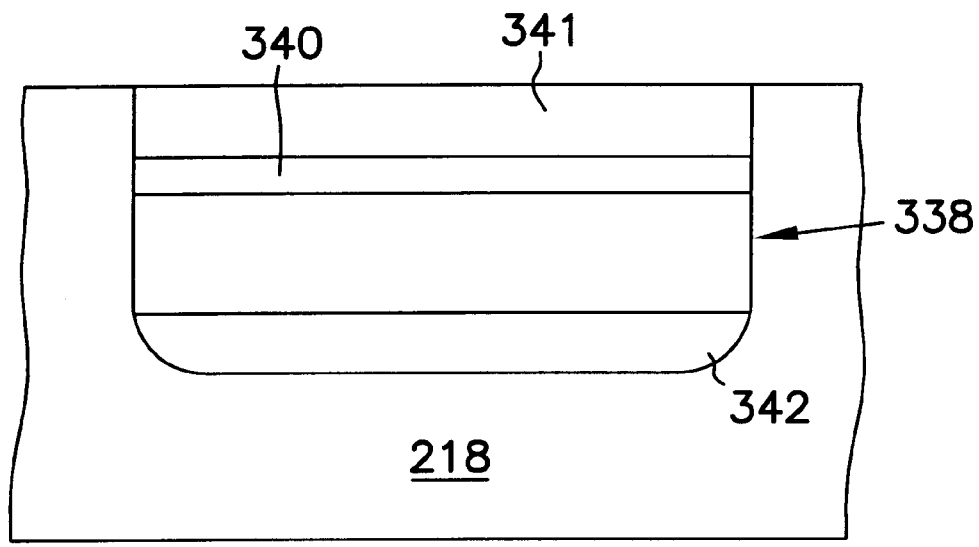
FIG. 3C is a cross-sectional representation of a retrograde well formed in accordance with the method of the invention.

The voltage supply Vs, or the acceleration tube voltage controller 210 of the acceleration tube 226, as shown in FIG. 2, is ramped during formation of an optimized retrograde well 338 in FIG. 3C. Initially, the acceleration tube voltage (V) is zero. Then, it is ramped at a rate of approximately 75 to 160 keV/s up to approximately 25 to 50 keV at point 444 to form region 341. The voltage is then held constant or ramped slowly at up to 60 keV/s to between 50 and 100 keV until a time at point 446 to form the surface tailoring implant 340. Then, the voltage (V) is ramped at a rate of approximately 300 to 2,500 keV/s up to approximately 200 keV to 1 MeV at point 448 to form a lower, substantially uniform doped region between surface tailoring implant 340 and junction barrier 342 at the bottom of the retrograde well 338. To complete formation of the junction barrier 342, the voltage (V) is held constant, or ramped at a rate of approximately up to 250 keV/s up to approximately 500 Kev to 1 MeV at point 449, where the voltage supply Vs, voltage controller 210 and/or the beam current supply 212 are turned off. Note that, as in all the embodiments discussed, actual angles, beam currents, voltages and ramping rates may vary depending on the voltage and current supplies, motors, and type of implanter 208 used, and the size and structure of the devices being implanted. Such angles, beam currents, and voltages are easily determinable by one of average skill in the art to obtain desired doping profiles. It is further anticipated that the ranges and ramping rates discussed above will be further extended with future improvements in equipment without departing from the spirit of the invention.

Figure 5C:
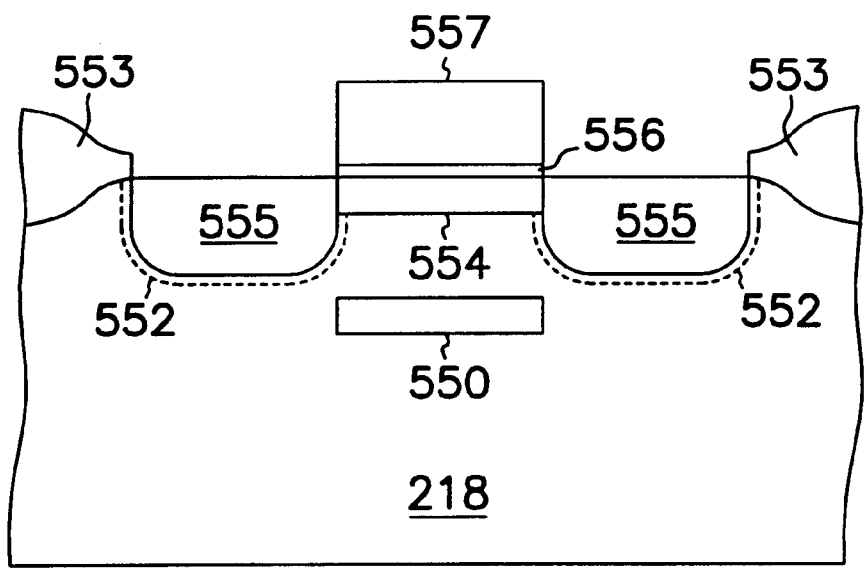
FIG. 5C is a cross-sectional representation of a dynamic random access memory transistor formed in accordance with one embodiment of the present invention.
Figure 5A:
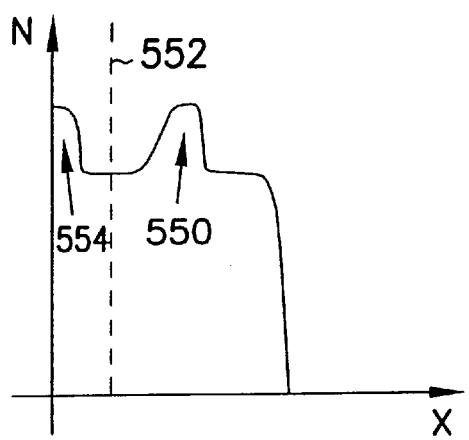
FIG. 5A is a doping profile for an optimized dynamic random access memory transistor produced using the method of the invention.
Figure 5B:
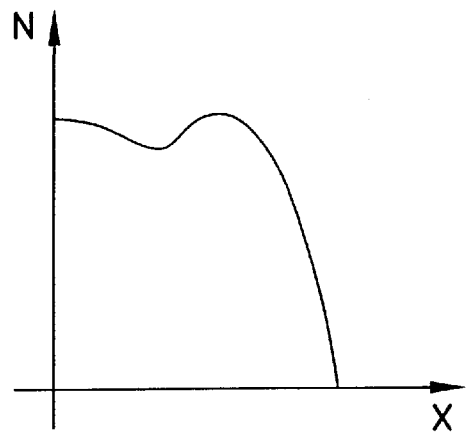
FIG. 5B is a conventional prior art dynamic random access memory transistor doping profile.

The programmable waveforms can be adjusted to compensate for implant phenomena such as channeling, transient enhanced diffusing, straggle, etc. The implanter 208 of the invention is also useful for forming transistors, such as an access transistor used in a dynamic random access memory (DRAM), the doping profile of which is shown in FIG. 5A and the cross-sectional representation of which is shown in FIG. 5C. However, this invention can be used for forming any transistor structure in an IC. Transistors, having dopant gradients exceeding N orders of magnitude per 0.1 micron depth change (where N=4, 5, 6, ... ), are formed using the method of the invention.

As shown in FIGS. 5A and 5C, active areas are defined in a wafer 218 by defining field oxide 553 and a gate oxide 556 using a technique, such as LOCOS (LOCal Oxidation of Silicon). When forming DRAM access transistors using the invention, a punch-through suppression implant 550, having a peak concentration of approximately $1\times10^{17}$ ions/cm$^3$ to $1\times10^{18}$ ions/cm$^3$, is formed below a maximum depletion width 552 of the DRAM storage node approximately 0.4 to 0.7 microns below the surface of the wafer 218 and the gate oxide 553. The sharp doping profile of the punch-through suppression implant 550 optimizes refresh capabilities. By preventing the depletion region from reaching high field regions created by the punch through implant 550 which typically causes junction leakage by trap assisted tunneling and other mechanisms. A channel implant 554, having a peak concentration of approximately $1\times10^{17}$ ions/cm$^3$ to $5\times10^{16}$ ions/cm$^3$, is formed at the surface of the wafer 218 to a depth of approximately 0.2 microns between source/drain regions 555 of the transistor. Subsequently, a gate structure 557 is formed on the gate oxide layer 553, as well known to one skilled in the art. By reducing the dopant concentration (N) to approximately $1\times10^{16}$ ions/cm$^3$ to $5\times10^{16}$ ions/cm$^3$ around the maximum depletion width 552 of the DRAM storage node, trap-assisted tunneling is suppressed, reducing refresh problems due to junction leakage.

Figure 6:
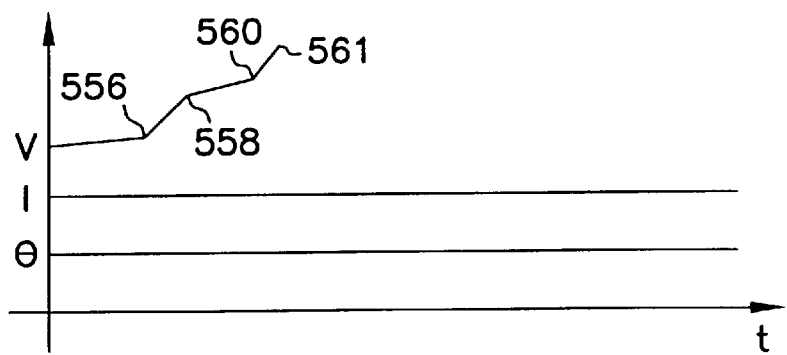
FIG. 6 is a graphical representation of implanter waveform versus time for forming an optimized dynamic random access memory transistor, as shown in FIGS. 5A and 5C.

FIG. 6 illustrates the programmable waveform used to form the optimized access transistor of FIG. 5A versus time (t). In this example, the implant angle (θ) is held constant. This angle (θ) is typically zero degrees, measured perpendicular from the plane of the wafer 218. However, depending on one's desire, this angle (θ) can be adjusted accordingly to implant complex topographies. The beam current (I) is also held constant in this example. For forming a transistor, the beam current is typically approximately 0 to 20 mA, depending on the implanter used. The voltage (V) of the acceleration tube 226, as shown in FIG. 2, is ramped during formation of an optimized retrograde well. In the example shown in FIG. 6, initially, the voltage (V) is zero and the beam current is held constant at approximately 0.1 μA. Then, the voltage (V) is ramped at a rate of approximately 30 to 65 keV/s up to approximately 10 to 20 keV at point 556, to form the channel implants 554. Next, the voltage (V) is ramped at a rate of approximately 0 to 190 keV/s up to approximately 20 to 50 keV at point 558. Then, the voltage (V) is ramped at a rate of approximately 0 to 160 keV/s up to approximately 50 to 100 keV at point 560 to form the punch-through suppression implant 550. From point 560, the voltage (V) is ramped at a rate of approximately 0 to 190 keV/s up to approximately 100 to 160 keV to finish forming the transistor at point 561, where the voltage (V) and/or the beam current supply 212 are turned off.

According to another aspect of the invention, the beam current is varied during implantation by ramping the beam current from current supply 212. A ramping current supply 212, as well known to one skilled in the art, replaces a constant beam current supply in conventional implanters. This aspect of the invention is particularly useful for forming junctions 762, such as the one shown in FIG. 7, having a dopant gradient exceeding N orders of magnitude per 0.1 micron depth change (where N=4, 5, 6, . . .). In this example, the voltage (V), from voltage supply 210, is also ramped during implantation, as shown in FIG. 8. Initially, the voltage (V) is 10 keV. The voltage (V) is then ramped at a constant rate of approximately 125 keV/s to approximately 30 keV to form a junction. The current is varied during the implantation process in a two-step technique. Initially, a high beam current, such as approximately 1 mA, is used, resulting in a high implant dose. Such a high beam current generates defects 764 in the semiconductor material of the wafer 218, making the implant area of the wafer 218 amorphous. Then, once the voltage (V) attains a sufficiently high level to put ions below the implanted layer, such as approximately 20 keV after approximately 0.8 seconds, the beam current is reduced at point 865 to a low enough level, such as 0.1 mA, that the combination of the high voltage (V) and the low implant dose results in an implant, which is below the threshold for substrate damage, thus forming a defect free layer 766 below the amorphous layer 768 in the wafer 218. After approximately 0.8 seconds, the voltage supply 210 and/or the beam current supply 212 are turned off to complete formation of the junction 762.

Figure 7:
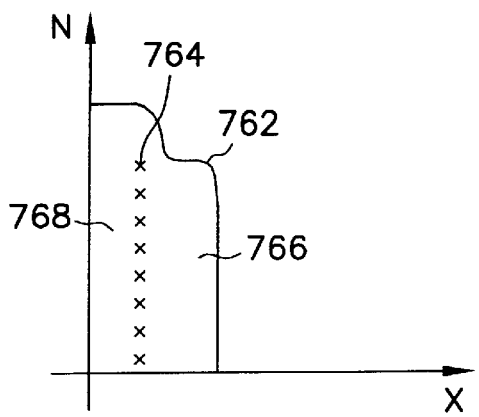
FIG. 7 is a doping profile for a junction created using a variable beam current of the invention.
Figure 8:
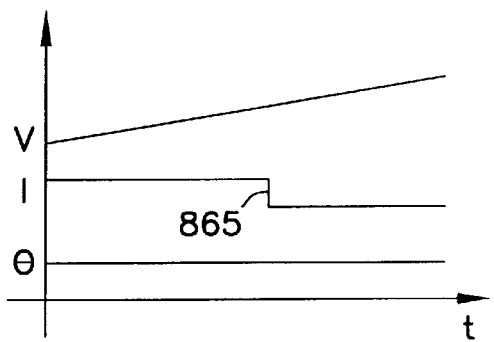
FIG. 8 is a graphical representation of implanter waveform versus time for forming the junction shown in FIG. 7.

In the completed junction 762, the doping profile of which is shown in FIG. 7, a layer of implant defects 764 resides at the interface between the amorphous layer 768 and the defect-free layer 766. By forming a defect-free layer 766 below the amorphous layer 768, the junction 762 has a reduction in junction leakage because the defects 764 are isolated from the junction area 762, an area which is critical to electrical performance. This technique is advantageous as compared to previously used techniques of implanting dopants to form an amorphous region 768 and then driving the dopants to at or below the implant defects 764 with a thermal step. Such thermal steps consume valuable thermal budget and often do not adequately drive the defects away from critical areas, such as junctions. As device densities decrease, shallower junctions are becoming more prevalent. It is thus desirable to form junctions 762 using the technique of this invention, so as to prevent device degradation associated with such defects 764 which are difficult to anneal out, while conserving thermal budget.

According to yet another aspect of the invention, a variable implant angle (θ) is used during implantation by mechanically-coupling a programmable stepper motor to a wafer table during implantation. This aspect of the invention is particularly advantageous for implanting complex topographies or three dimensional structures, such as sidewalls of a memory cell. However, other complex topographical structures, such as contact holes, can be implanted using this invention.

Figure 9:
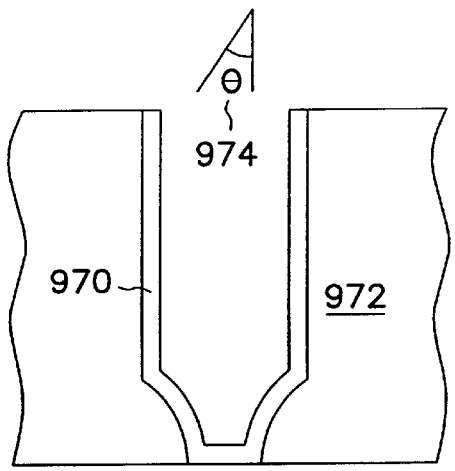
FIG. 9 is a cross-sectional representation of a bottom plate electrode for a memory cell, which is doped using a variable angle implant of the invention.

FIG. 9 illustrates a bottom plate electrode 970 of a memory cell, such as polysilicon, formed in a substrate 972 or other structure formed on top of a substrate such as BPSG, which is implanted with a dopant according to the invention. The implant energy (V), angle (θ) 974, and beam current (I) are varied during a single implantation step to properly implant the surface of the bottom plate electrode 970. Of particular importance is implanting sidewalls of such structures having complex topographies. Previously, the bottom of such structures had to be implanted in a separate step from implanting the sidewalls of the structures, rotating twice at 180 degrees for elongate structures, or four times at 90 degree angles for other structures.

Figure 10:
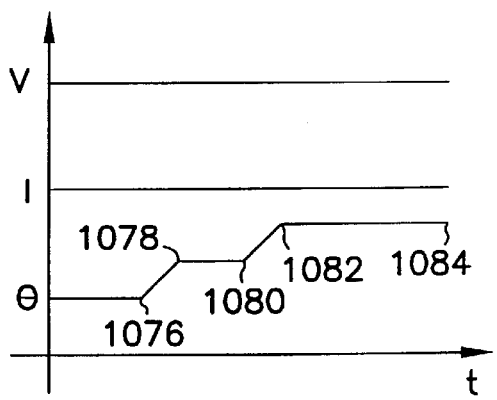
FIG. 10 is a graphical representation of implanter waveform versus time for implanting the bottom plate electrode shown in FIG. 9.

In this example, the voltage (V) is held constant during implantation, as shown by the illustration of waveform versus time (t) in FIG. 10, from voltage controller 210, to achieve a uniform implant depth. For example, a voltage of approximately 20 to 100 keV is typically used to implant an n-type dopant, such as phosphorus, in a bottom plate electrode 970. The current (I) is also held constant during the implantation step, such as at approximately 0.1 mA in this example. However, for a typical implant, the current (I) is approximately 0 to 20 mA, depending on the implanter used. During implantation, the implant angle (θ) 974 is initially held constant at approximately −10 degrees (measured perpendicular from the surface of the substrate 972) for approximately 0.28 seconds. Then, at point 1076, the implant angle (θ) is ramped at a rate of approximately 70 to 75 degrees/s from −10 to 0 degrees at point 1078. At an implant angle (θ) of 0 degrees, the implant angle (θ) is held constant for approximately 0.14 seconds. At point 1080, the implant angle (θ) is ramped at a rate of approximately 70 to 75 degrees/s to approximately 10 degrees at point 1082. The implant angle (θ) is then held constant for approximately 0.14 seconds to adequately implant the entire topography of the bottom plate electrode 970, including the sidewalls, to a uniform dopant level. At point 1084, the voltage supply Vs, voltage controller 210 and/or the beam current supply 212 are turned off.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An ion implantation apparatus for implanting a wafer, comprising:
    a ramping beam current supply coupled to an ion source;
    a ramping acceleration tube that receives a plurality of ions from the ion source and directs them to the wafer in an ion beam; and
    a programmable motor mechanically coupled to a wafer table that holds the wafer for tilting the wafer relative to the ion beam.

2. An ion implantation apparatus for implanting a memory cell wafer, comprising:
    a constant beam current supply coupled to an ion source;
    a constant voltage acceleration tube that receives a plurality of ions from the ion source and directs them to the wafer;
    x and y axis scanners that deflect the plurality of ions from the constant voltage acceleration tube to a desired location on the wafer;
    a programmable motor mechanically coupled to a wafer table that holds the wafer for tilting the wafer in coordination with the x and y axis scanners relative to the ion beam during implanting of a sidewall of the memory cell at the desired location on the wafer.

3. An ion implantation apparatus for implanting a wafer, comprising:

a constant beam current supply coupled to an ion source;

an acceleration tube that receives a plurality of ions from the ion source and directs them to the wafer;

a voltage controller coupled to the acceleration tube that provides a ramping voltage; and a programmable motor mechanically coupled to a wafer table that holds the wafer for tilting the wafer relative to the ion beam during implanting.

4. An ion implantation apparatus for implanting a wafer, comprising:

a ramping beam current supply coupled to an ion source;

an acceleration tube that receives a plurality of ions from the ion source and directs them to the wafer in an ion beam;

a constant voltage supply connected across the acceleration tube; and a programmable motor mechanically coupled to a wafer table that holds the wafer for varying the angle of the wafer to the ion beam.

5. An ion implantation apparatus for implanting a wafer, comprising:

a constant beam current supply coupled to an ion source;

an acceleration tube that receives a plurality of ions from the ion source and directs them to the wafer in a beam;

a controller that provides a ramping voltage connected across the acceleration tube; and a wafer table that holds the wafer and is constructed and arranged for tilting the wafer relative to the beam during implanting.

6. An ion implantation apparatus for implanting a wafer, comprising:

a ramping beam current supply coupled to an ion source;

an acceleration tube that receives a plurality of ions from the ion source and directs them to the wafer;

a controller that provides a ramping voltage connected across the acceleration tube; and a wafer table that holds the wafer.

7. An ion implantation apparatus for implanting a wafer, comprising:

a ramping beam current supply coupled to an ion source;

an acceleration tube that receives a plurality of ions from the ion source and directs them to the wafer;

a constant voltage supply connected across the acceleration tube; and a wafer table that holds the wafer.

8. An ion implantation apparatus for implanting a wafer, comprising:

a beam current supply coupled to an ion source;

an acceleration tube that receives a plurality of ions from the ion source and directs them to the wafer as a beam;

a programmable motor mechanically coupled to a wafer table that holds the wafer, the wafer table constructed and arranged for adjusting the implant angle of the wafer to the ion beam during implanting; and means for controlling at least one of the beam current supply magnitude, acceleration tube acceleration voltage and programmable motor to vary at least one of beam current magnitude, the implantation energy and the implant angle during implanting thereby to provide well defined dopant profiles in a semiconductor device supported by the wafer.

9. An ion implantation apparatus for implanting a wafer, comprising:

a beam current supply coupled to an ion source, the beam current supply supplying a first beam current for a first time interval during implanting and then changing to a second beam current during a second time interval during implanting wherein the first beam current is larger than the second beam current;

an acceleration tube that receives a plurality of ions from the ion source and directs them to the wafer in a beam;

a controller that provides a ramping voltage connected across the acceleration tube for ramping the energy of the ion beam during implanting; and a wafer table that holds the wafer at a selected angle relative to the beam.

10. The ion implantation apparatus of claim 9 wherein the first beam current is approximately 0 to 20 mA.

11. The ion implantation apparatus of claim 9 wherein the second beam current is less than the first beam current.

12. The ion implantation apparatus of claim 11 wherein the first beam current is approximately 1 mA.

13. The ion implantation apparatus of claim 12 wherein the second beam current is approximately 0.1 mA.

14. An ion implantation apparatus for implanting a wafer with an amorphous layer above a substantially defect free layer, comprising:

a beam current supply coupled to an ion source, the beam current supply supplying a first beam current for a first time interval during implanting where the first beam current is sufficient to produce a substantial number of defects and an amorphous implant layer and then changing to a second beam current, less than the first beam current during a second time interval during implanting to provide a reduced implant dose and a substantially defect free layer below the amorphous layer;

an acceleration tube that receives a plurality of ions from the ion source and directs them to the wafer in a beam;

a controller that provides a ramping voltage connected across the acceleration tube for ramping the energy of the ion beam during implanting, the ramping voltage provided to the acceleration tube being sufficiently high during the second time interval to put ions below the amorphous implanted layer; and a wafer table that holds the wafer at a selected angle relative to the beam.

15. The ion implantation apparatus of claim 14 wherein the first beam current is approximately 0 to 20 mA.

16. The ion implantation apparatus of claim 14 wherein the second beam current is less than the first beam current.

17. The ion implantation apparatus of claim 16 wherein the first beam current is approximately 1 mA.

18. The ion implantation apparatus of claim 17 wherein the second beam current is approximately 0.1 mA.

* * * * *